(12) United States Patent
Kitazawa et al.

(10) Patent No.: US 6,335,556 B1
(45) Date of Patent: Jan. 1, 2002

(54) SEMICONDUCTOR DEVICE AND METHOD FOR MANUFACTURING SEMICONDUCTOR DEVICE

(75) Inventors: Masashi Kitazawa; Masayoshi Shirahata; Tomohiro Yamashita, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/222,877

(22) Filed: Dec. 30, 1998

(30) Foreign Application Priority Data

Jun. 22, 1998 (JP) ............................................ 10-174622

(51) Int. Cl.[7] .............................................. H01L 29/00
(52) U.S. Cl. ...................................... 257/510; 257/392
(58) Field of Search .............................. 257/510, 520, 257/392, 411

(56) References Cited

U.S. PATENT DOCUMENTS

| 5,448,102 | A | * | 9/1995 | Gaul et al. .................. 257/510 |
| 5,646,063 | A | | 7/1997 | Mehta et al. |
| 5,702,980 | A | | 12/1997 | Yu et al. |
| 5,929,504 | A | * | 7/1999 | Mogami et al. ............ 257/510 |

FOREIGN PATENT DOCUMENTS

| JP | 7-326659 | 12/1995 |
| JP | 10-22397 | 1/1998 |

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A narrow trench (2) is formed in a memory circuit region (4) and a wide trench (200) is formed in a logic circuit region (5). An oxide (3B) is formed by CVD to fill the trench (2) and planarization is performed thereon. A thin oxide film (7) is formed by thermal oxidation in an active region, and a polysilicon (15A) for gate electrode is formed and etched only in the memory circuit region (4). At this time, the polysilicon (15B) remains in a seam (6). An oxide film (11) is deposited by CVD, to play the first role of covering the seam (6) and the second role of constituting a thick oxide film together with the oxide film (7). Thus, the trenches of different widths and the oxide films of different thicknesses are formed in a semiconductor substrate, to solve the problem of burying failure which is likely to occur in a narrow trench.

4 Claims, 6 Drawing Sheets

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device including a plurality of elements which have different electrical characteristics and a method for manufacturing the semiconductor device.

2. Description of the Background Art

To form a plurality of elements having different electrical characteristics on a semiconductor substrate, in general, it is necessary to divide the semiconductor substrate into regions by characteristics of the elements and form the elements under different conditions on a region-by-region basis. In a logic mixed memory where a logic circuit and a memory circuit are formed together in a chip, especially, the elements should be formed with care. That is because oxide films of different thicknesses have to be formed on a substrate. Specifically, a MOS transistor in a logic circuit uses a thin gate oxide film for faster operation while a MOS transistor in a DRAM memory cell circuit uses a thicker gate oxide film than that in the logic circuit since it has to ensure reliability of oxide film because of operation with high voltage across a word line.

FIG. 9 is a cross section illustrating a structure of a logic mixed memory. This figure partly shows a memory circuit region 4 and a logic circuit region 5 on a semiconductor substrate 1 and in each of the regions, some elements are provided being isolated by isolation regions 20. A transistor 9 is provided with a source/drain region 17, a gate electrode 15D, a gate oxide film 7 and a side-wall oxide film 16, and a transistor 10 is provided with the source/drain region 17, a gate electrode 15E, a gate oxide film 8 and the side-wall oxide film 16. The gate oxide film 8 of the transistor 10 in the memory circuit region 4 is thick and the gate oxide film 7 of the transistor 9 in the logic circuit region 5 is thin.

In short, to form the logic mixed memory, a technique of forming a plurality of MOS transistors having oxide films of different thicknesses on a substrate is needed. As such a technique, there is a method where a thin oxide film is formed by oxidizing uniformly on the whole surface of a wafer, the oxide film on a memory circuit region is removed by etching with a logic circuit region masked and thereafter a thick oxide film is formed by oxidizing the memory circuit region of the wafer again. Or, conversely, a method where a thick oxide film is formed first and then a thin oxide film is formed is shown in Japanese Patent Application Laid Open Gazette 10-22397, for example.

With size reduction of semiconductor device, it is becoming indispensable to use a trench isolation in forming a device, for efficient isolation of elements constituting the device. The trench isolation refers to a method for electrical isolation of elements, where a trench is formed in a substrate by anisotropic etching and filled with an insulating film by CVD and the like and planarization is performed on its surface. The trench isolation has an advantage of forming a narrow and deep isolation region since it hardly causes bird's beak which would be caused by a prior-art isolation method, LOCOS. The logic mixed memory also needs the trench isolation.

In general, to enhance integration in the memory circuit region, it is necessary to reduce a trench region as well as an active region in which elements exist. Therefore, the trench in the memory circuit region is formed narrower than that in the logic circuit region. FIG. 10 is a cross section showing only trenches with transistors omitted. A trench 2 in the memory circuit region 4 is narrower than a trench 200 in the logic circuit region 5. The trench 200 in the logic circuit region 5 typically has a width of about 0.28 $\mu$m and the trench 2 in the memory circuit region 4 typically has a width of about 0.24 $\mu$m, though the widths vary depending on manufacturing method, device and the like. Naturally, trenches of various widths are formed in a circuit.

Oxides 3A and 3B are provided in the trenches 200 and 2, respectively. On a surface of the oxide 3B filling the trench 2 in the memory circuit region 4, a pothole 6 called "seam" is created. The following discussion will be made on the cause of creation of the seam 6. Using the CVD make it hard to supply a gas in a very small region. When the oxide 3 is gradually deposited in the trench 2 by CVD inwardly from an inwall of the narrow trench 2, a portion where no oxide 3 is deposited is likely to exist in the center of the trench 2. In some cases, there is a void inside the trench 2. This has an influence on a portion of the oxide deposited above the uppermost surface of the trench, to create a V-shaped pothole thereon. Further, after removing the oxide 3 deposited above the uppermost surface of the trench by etch-back treatment, CMP or the like to perform planarization on the surface, the seam 6 is likely to exist in the center of the trench as shown in FIG. 10. That is because the etching and the like proceed faster and the remaining void is likely to show up in the center of trench due to little oxide 3 deposited therein. The creation of the seam 6 becomes pronounced in particular when the trench has a width of 0.2 $\mu$m or less.

That is the cause of creation of the seam. The next discussion will be made on a problem caused by existence of the seam 6. For example, when a polysilicon is formed uniformly on a surface of the substrate in the memory circuit region 4 of FIG. 10 and thereafter an unnecessary portion is etched, with a necessary portion left on a predetermined surface other than the trench 2, to form a gate electrode, if the seam 6 exists, the polysilicon is likely to remain in the seam 6. The trench 2 extends perpendicular to the sheet of FIG. 10 and the remaining polysilicon linearly exists in this direction.

Through several steps after that, the MOS transistor structure 10 is formed as shown in FIG. 11. FIG. 12 illustrates the MOS transistor structure 10 viewed from the upper side, i.e., from the direction of the arrow (FIG. 11 is a cross section taken along the line of XI—XI of FIG. 12). In FIG. 12, the polysilicon 15E serving as a gate electrode is formed across the trench 2 for the convenience of interconnection. When the polysilicon 15E remains in the seam 6 existing in the trench 2, if another gate electrode material (not shown in FIG. 12), for example, exists across the trench 2, a short circuit occurs between the gate electrode material and the polysilicon gate electrode 15E, causing a hindrance in the circuit.

That is the problem caused by existence of the seam. Various measures against the creation of the seam have been considered. For example, Japanese Patent Application Laid Open Gazette 7–326659 discloses a technique of filling a trench with an oxide in two stages. In the first stage, the first oxide film is deposited up to above a surface of a trench. In the subsequent stage, an etching is performed to the extent that the oxide inside the trench should be slightly removed and left to some extent, and the second oxide film is deposited thereon up to above the surface of the trench and thereafter etched for planarization of the surface.

In consideration of the above prior art, to provide a logic mixed memory in which trench isolation regions of different widths and oxide films of different thicknesses are formed in a semiconductor substrate, it is necessary to execute a step for coping with the seam on the trench isolation region and thereafter execute a step of forming the oxide films of different thicknesses. When the prior art is simply used, the method needs increased number of steps even becomes inefficient and costly due to repeating steps of forming and removing the oxide films.

SUMMARY OF THE INVENTION

The present invention is directed to a semiconductor device. According to a first aspect of the present invention, the semiconductor device comprises: a semiconductor substrate having a surface; a trench having an opening in the surface of the semiconductor substrate; a first insulator provided inside the trench; a conductor existing on a surface of the first insulator opposed to the opening; and a second insulator covering at least the conductor.

According to a second aspect of the present invention, the semiconductor device of the first aspect further comprises: a third insulator provided on the surface of the semiconductor substrate, the second insulator is provided also on the third insulator, and the semiconductor device further comprises: a first MOS element having the third insulator as a gate insulating film and isolated from an adjacent first MOS element by the trench; and a second MOS element having the second and third insulators as a gate insulating film and isolated from an adjacent second MOS element by the trench.

The present invention is also directed to a method for manufacturing a semiconductor device. According to a third aspect of the present invention, the method comprises the steps of: (a) forming a trench inside a semiconductor substrate having a surface divided into first and second regions to have an opening in the surface and forming a first insulator inside the trench; (b) forming a second insulator in a portion of the surface where no opening of the trench is provided; (c) forming a conductor on the whole surface of a structure obtained by the steps (a) and (b); (d) removing the conductor in the first region to expose the second insulator; and (e) forming a third insulator on the whole surface of at least the first region in the structure obtained by the steps (a) and (b).

According to a fourth aspect of the present invention, in the method of the third aspect, the conductor existing on a surface of the first insulator opposed to the opening is left in the step (d).

According to a fifth aspect of the present invention, in the method of the third or fourth aspect, the trench in the first region is narrower than that in the second region.

In the semiconductor device in accordance with the first aspect of the present invention, if the conductor exists on the first insulator in the trench, the second insulator avoids a short circuit between the conductor and other interconnect lines.

In the semiconductor device of the second aspect of the present invention, since the gate insulating film of the first MOS element is thinner than that of the second MOS element, the first MOS element is used in the logic circuit to achieve a faster operation and the second MOS element is used in the memory circuit to achieve a high breakdown-voltage operation, for example, and thus both the first and second MOS elements can be formed on a semiconductor substrate.

In the method for manufacturing a semiconductor device of the third aspect of the present invention, it becomes easier to form the MOS element with a thick gate insulating film consisting of the second and third insulators in the first region and the MOS element with a thin gate insulating film made of the second insulator in the second region. Moreover, when the conductor is not completely removed in the step (d), the first and third insulators isolate the remaining conductor from the surrounding elements, to avoid an unnecessary short circuit.

In the method of the fourth aspect of the present invention, if the flatness of the first insulator is deteriorated, the conductor remaining at the opening of the trench improves the flatness, thereby making it easier to form the third insulator.

In the method of the fifth aspect of the present invention, since the third insulator covers the conductor in the narrower trench, remarkable effects of the third and fourth aspects can be achieved in a trench where the flatness of the first insulator is likely to deteriorate and the conductor is likely to remain in the step (d).

An object of the present invention is to provide a semiconductor device in which trench isolation regions of different widths and oxide films of different thicknesses are formed and the oxide films serve to cope with seams created in surfaces of the trench isolation regions, and to provide a method for manufacturing the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 6:
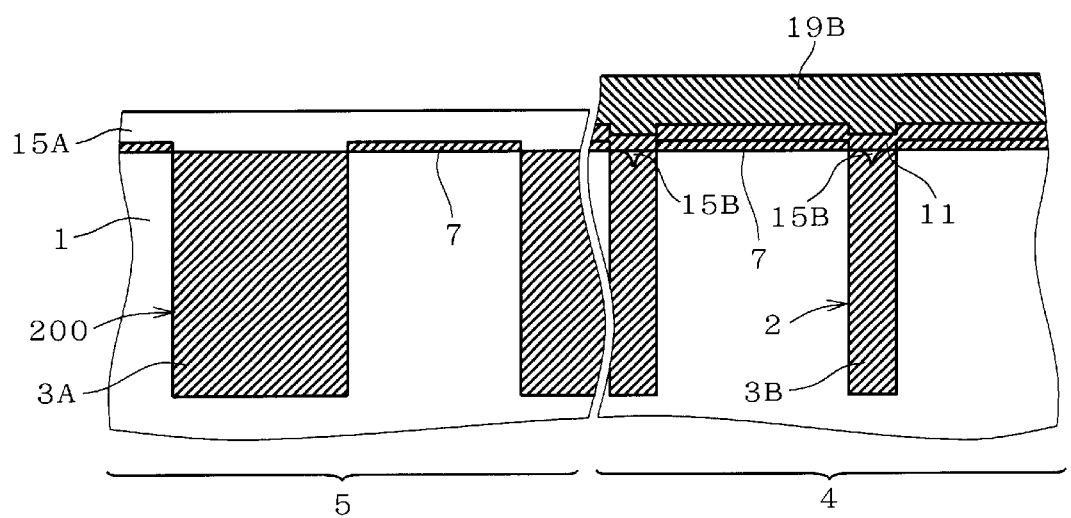
Figure 7:
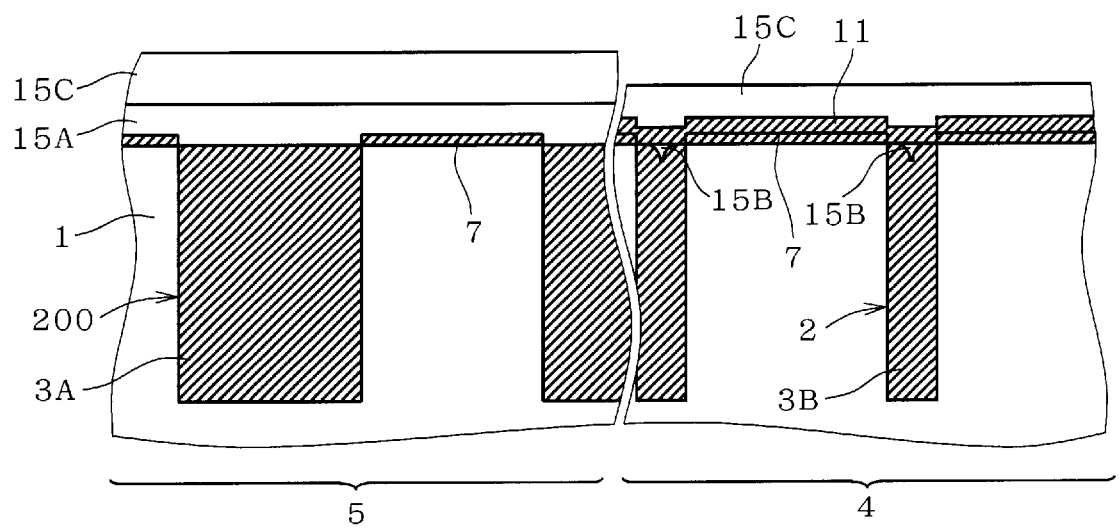
Figure 8:
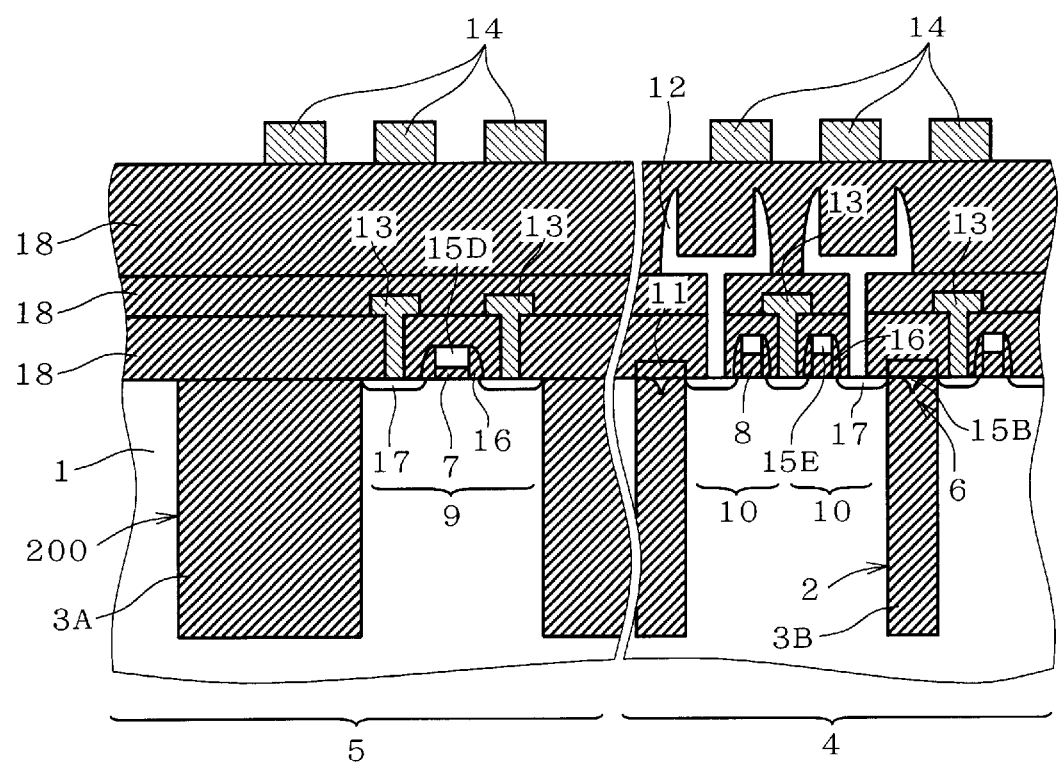
FIG. 8 is a structure diagram showing a device in accordance with the first and second preferred embodiments of the present invention.
Figure 9:
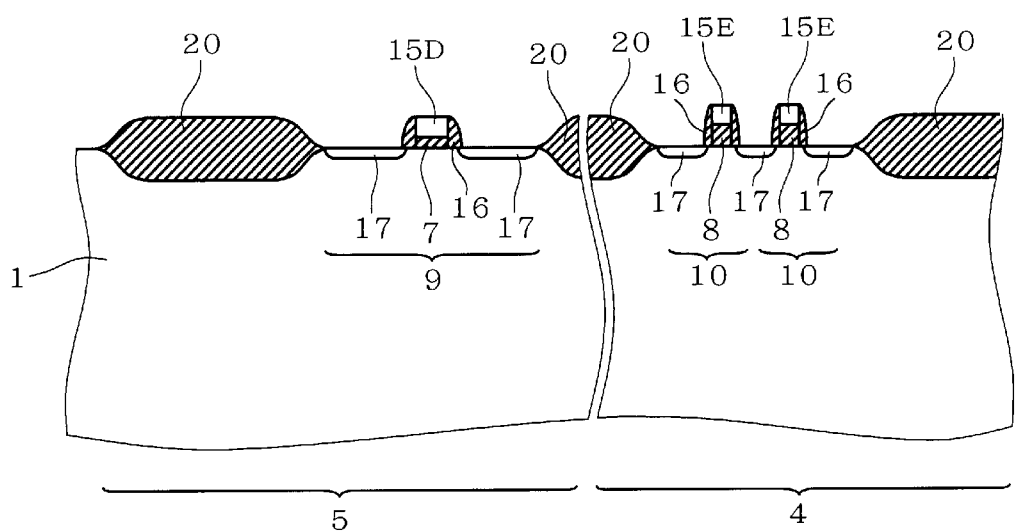
FIGS. 9 to 12 illustrate manufacture examples in the prior art.
Figure 10:
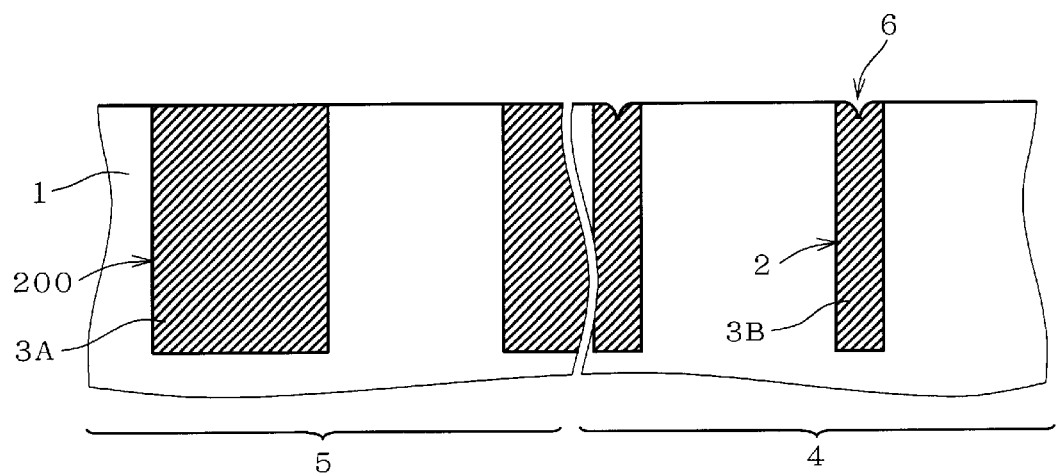
Figure 11:
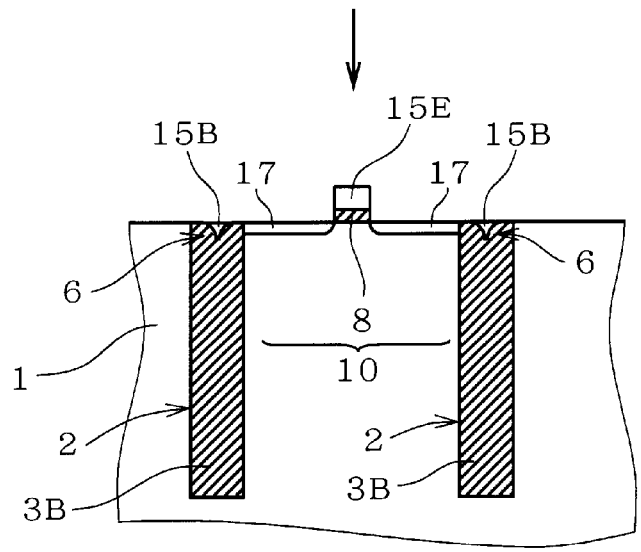
Figure 12:
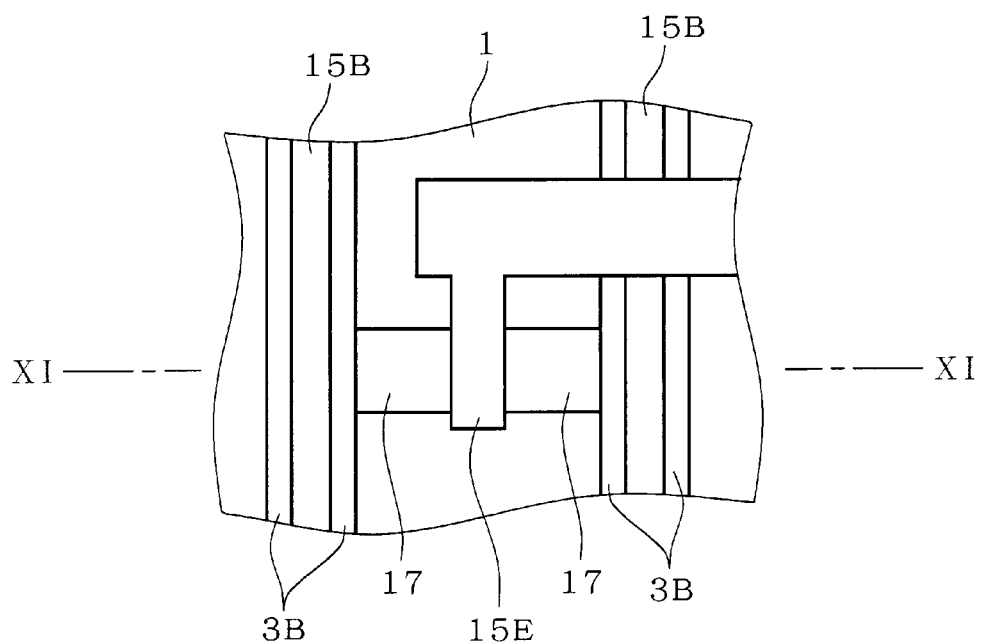

FIGS. 1 to 8 illustrate steps of a process for manufacturing a semiconductor device, using a method in accordance with the present invention. FIG. 8 is a view of a finished semiconductor device, partly showing the memory circuit region 4 and the logic circuit region 5. In these regions provided are elements, such as the transistors 9 and 10 and polysilicon storage node capacitors 12, tungsten plugs 13 and aluminum wirings 14 which are placed with interlayer insulating films 18 such as TEOS oxide films (having a thickness of e.g., about 500 to 1000 nm) interposed. For simplification of illustration, this figure shows no dielectric or opposing electrodes of the storage node capacitors 12 and only one-layered interconnection, not multilayered one, of the aluminum wirings 14.

Figure 1:
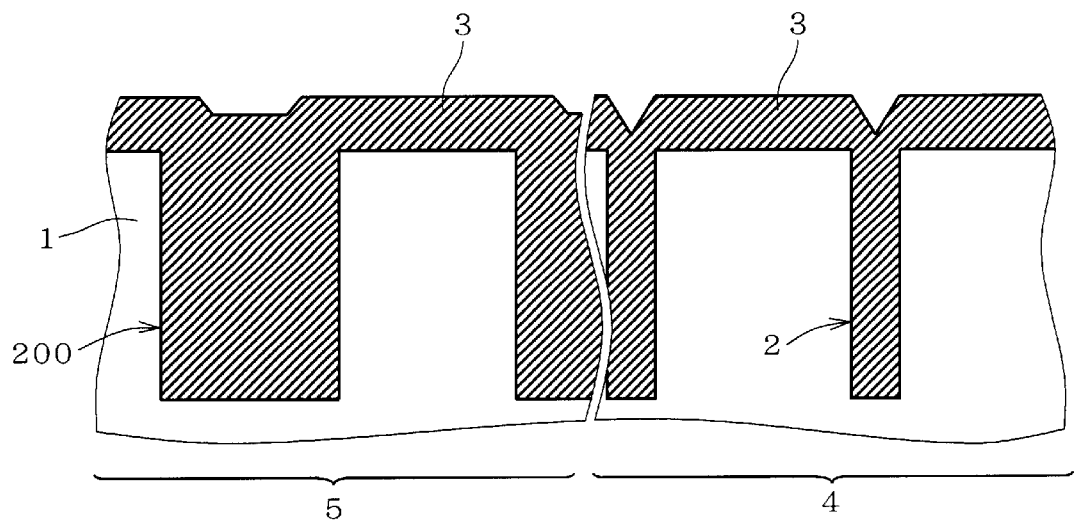
FIGS. 1 to 7 illustrate steps in a method in accordance with first and second preferred embodiments of the present invention.

Now, a process to accomplish the structure of FIG. 8 will be discussed below. As shown in FIG. 1, first, the trench 200 having a width of about 0.28 $\mu$m and a depth of about 300 nm and the trench 2 having a width of about 0.18 $\mu$m and a depth of about 300 nm, for example, are formed in the semiconductor substrate 1 by anisotropic etching, and thereafter the TEOS oxide film 3 is deposited by CVD to fill the trench 2.

Figure 2:
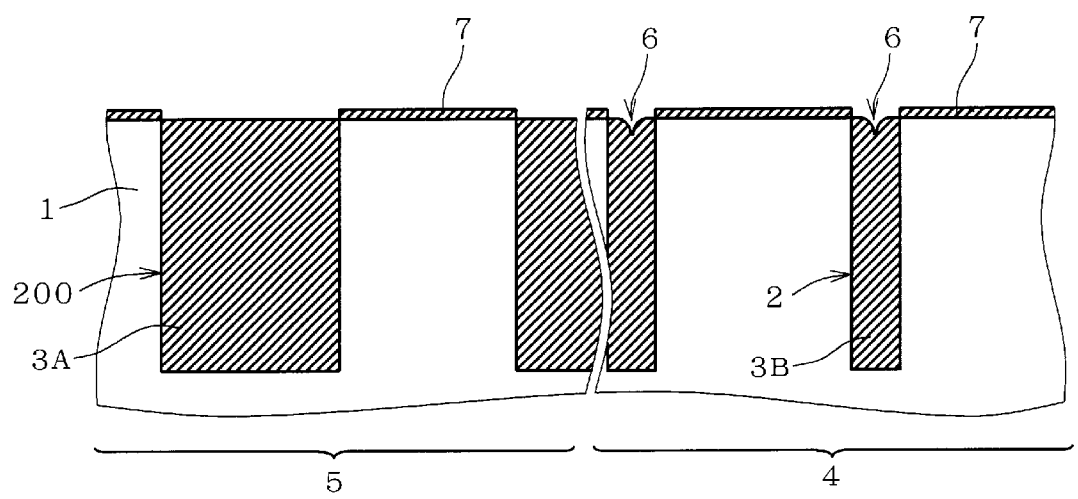

Subsequently, planarization is performed by CMP on a surface of the oxide film 3 and the oxide films 3A and 3B are deposited on the trenches 200 and 2, respectively. At this time, the above-discussed seam 6 shows up in a surface of the oxide film 3B. The surface of the semiconductor substrate 1 to serve as an active region is thermally oxidized in a wet atmosphere of e.g., 850° C., to form the thin gate oxide film 7 having a thickness of about 3 nm. This state is shown in FIG. 2.

Figure 3:
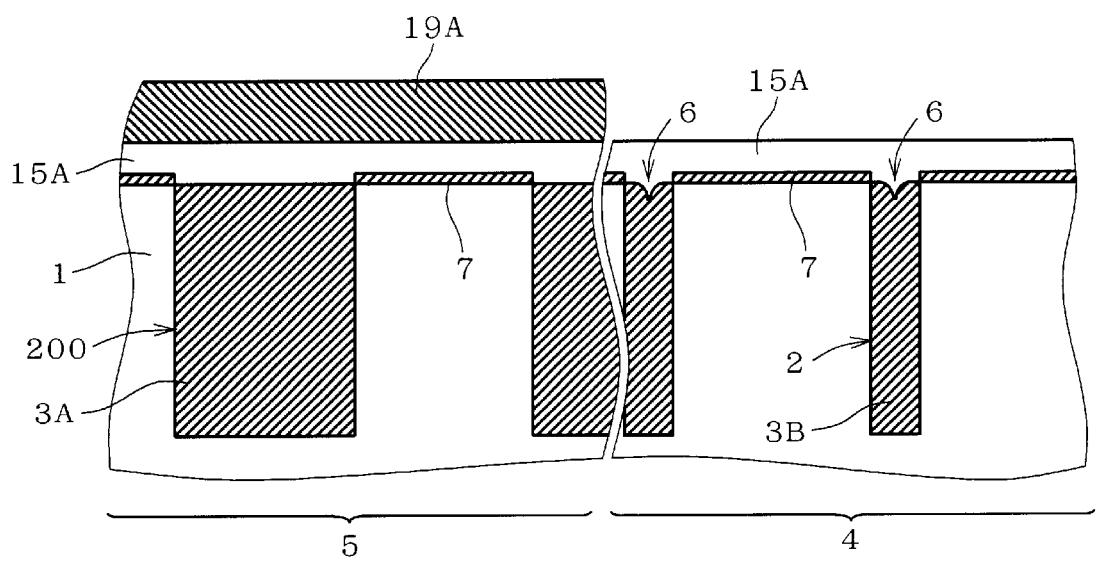

Next, a polysilicon 15A is deposited on the whole surface of the substrate 1 to have a thickness of about 100 nm, which serves as a gate electrode material of the MOS transistor 9 formed later in the logic circuit region 5. To remove the polysilicon 15A on the memory circuit region 4, an upper surface of the polysilicon 15A in the logic circuit region 5 is patterned with a photoresist 19A. This state is shown in FIG. 3.

When the polysilicon 15A is deposited on the whole surface of the substrate 1, the polysilicon 15A gets in the seam 6 of the trench 2 in the memory circuit region 4. The polysilicon has a better step coverage than TEOS of which the oxide film 3 is made. Though there are possibilities of nonuniform deposition of the oxide film 3 inside the trench 2 and creation of a cavity at the depths of the seam 6, the polysilicon 15A covers the seam 6 near the surface of the seam 6.

Figure 4:
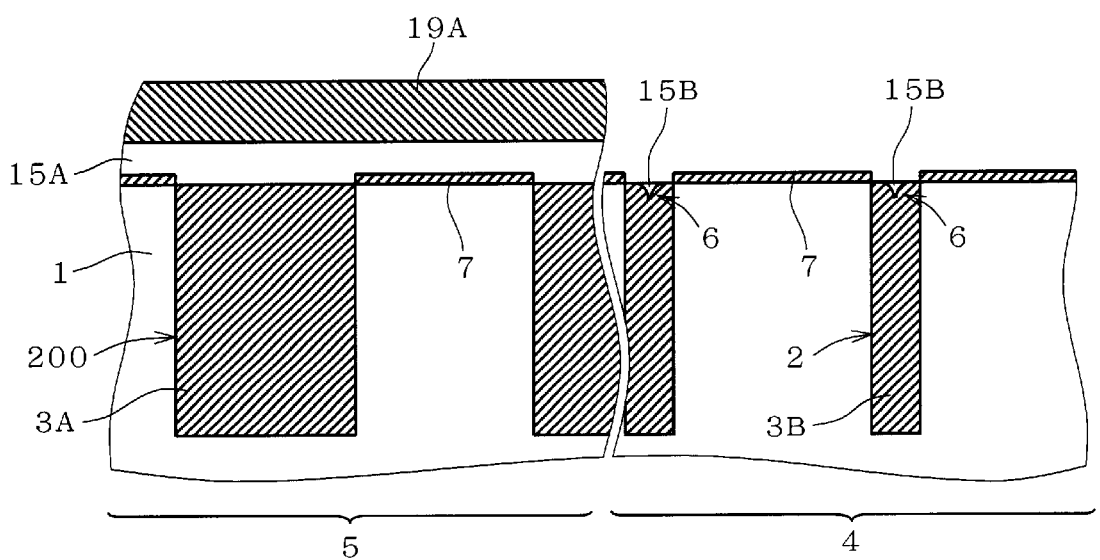

Subsequently, the polysilicon 15A in the memory circuit region 4 is removed by anisotropic etching. This state is shown in FIG. 4. If the polysilicon 15A which gets in the seam 6 in the preceding step is not completely removed, there arises a possibility of causing a short circuit. This possibility, however, is resolved in the following step, and in this step, not too much etching is performed so that a polysilicon 15B may remain in the seam 6. The reason for that will be discussed in the following step.

Figure 5:
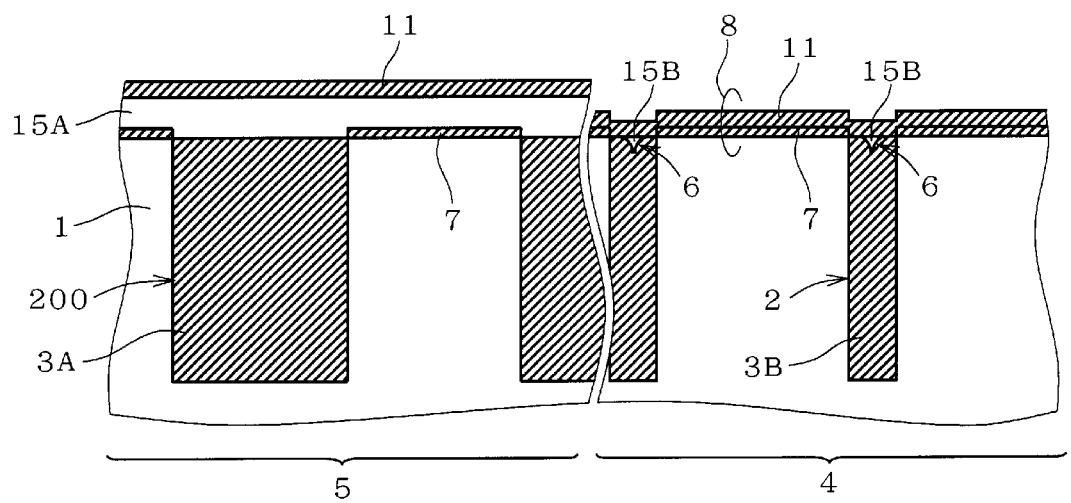

Next, the photoresist 19A is removed and as shown in FIG. 5, a TEOS oxide film 11 is deposited by CVD to have a thickness of about e.g., 5 to 10 nm on the whole surface of the substrate. In the memory circuit region 4, the oxide film 11 has two roles. First, the oxide film 11 is formed on the oxide film 7, to form the thick gate oxide film 8 together with the oxide film 7. That allows two gate oxide films 7 and 8 of different thicknesses to be formed in the logic circuit region 5 and the memory circuit region 4. Secondly, the oxide film 11 covers the polysilicon 15B left inside the seam 6 in the preceding step. That avoids the above problem of short circuit. The thickness of the oxide film 11 is determined to be 5 to 10 nm so that the oxide film 11 can achieve the two roles at the same time. Specifically, the thickness of this values is thick enough to thicken the gate oxide film 8 of the MOS transistor 10 formed later in the memory circuit region 4 and can sufficiently cover the polysilicon 15B in the seam 6 to ensure insulation. However, too thick gate oxide film 8 is not desirable because it lowers MOS capacitance and requires longer time to execute the step.

The reason why the polysilicon 15B is left inside the seam 6 in the preceding step will be discussed. The polysilicon, which has an excellent step coverage as mentioned above, covers the opening in the surface of the seam 6. Since the problem of short circuit of the gate electrode is solved by forming the oxide film 11 on the upper surface of the oxide film 3B in which the polysilicon 15B exists in the seam 6, it is preferable to fill the seam 6 with the polysilicon, utilizing the excellent step coverage of the polysilicon, for easier formation of the oxide film 11. If little polysilicon 15B is left in the seam 6 due to excessive etching, a gas is hard to supply for a very small portion since the oxide film 11 is formed by CVD and it takes longer time to form the oxide film 11 well on the upper surface of the seam 6. Therefore, it is desirable to leave the polysilicon 15B in the seam, but the polysilicon 15B may be completely removed.

Next, the memory circuit region 4 is patterned with a photoresist 19B and the oxide film 11 in the logic circuit region 5 is removed by dry-etching. This state is shown in FIG. 6.

Subsequently, the photoresist 19B is removed and thereafter a polysilicon 15C is deposited, which serves as a gate electrode material of the MOS transistor 10 formed later in the memory circuit region 4. This state is shown in FIG. 7.

The polysilicons 15C and 15A for gate electrode in the logic circuit region 5 and the polysilicon 15C in the memory circuit region 4 are injected with a dopant, patterned with a photoresist and anisotropically etched to form the gate electrodes 15D and 15E. After that, the side-wall oxide film 16, the interlayer insulating film 18, tungsten plug 13, the storage node capacitor 12 and the like are formed, to obtain the structure of FIG. 8.

The process for manufacturing the structure which needs two kinds of gate oxide films of MOS transistors has been discussed above. There is a case where gate oxide films having three or more kinds of thicknesses are needed, such as a case of using a MOS structure as a capacitor. In this case, a plurality of regions provided with oxide films of desired thicknesses can be formed by repeating the steps of FIGS. 3 to 7 after the step of FIG. 7.

Therefore, when trench isolation regions of different widths and oxide films of different thicknesses are formed on a semiconductor substrate, using the method of this preferred embodiment allows better cost efficiency and reduction of time for manufacture without repeating the steps of forming and removing the oxide film to fill the seam, unlike using the prior-art technique shown in Japanese Patent Application Laid Open Gazette 7-326659.

Further, a semiconductor substrate having the structure where the trench isolation regions of narrow width and the oxide films of different thicknesses are provided and the oxide films are further provided so as to cover the seams on the trench isolation regions, as shown in FIGS. 5 to 8, can avoid the problem of short circuit occurring when an unnecessary conductor material gets in the seam.

The Second Preferred Embodiment

The second preferred embodiment adopts any method among a low pressure CVD, a TEOS-$O_3$ atmospheric pressure CVD and a sub-atmospheric CVD as the CVD used for forming the oxide film 3 to fill the trench 2 of the first preferred embodiment. Other steps and the like are the same as those of the first preferred embodiment.

For example, when a high-density plasma CVD is used to fill the trench, the seam is hard to create, but the device becomes costly and there arises a possibility of damage on the substrate in filling the trench. When any one of the above methods is used, though the seam is likely to exist, it is possible to cope with the seam by using the method of the first preferred embodiment and there are advantages of better cost efficiency and less damage.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:
a semiconductor substrate having a surface;
a trench having an opening in said surface of said semiconductor substrate;
a first insulator provided inside said trench;
a conductor existing on a surface of said first insulator opposed to said opening;
a second insulator covering at least said conductor;
a third insulator provided on said surface of said semiconductor substrate,
said second insulator being provided also on said third insulator;
a first MOS element having said third insulator as a first gate insulating film and isolated from an adjacent first MOS element by said trench; and
a second MOS element having said second and third insulators as a second gate insulating film and isolated from an adjacent second MOS element by said trench.

2. A semiconductor device comprising:
a semiconductor substrate having a surface;
a trench having an opening in said surface of said semiconductor substrate;
a first insulator provided inside said trench and having a surface including a v-shaped pothole;
a conductor existing in said pothole;
a second insulator covering at least said conductor;
a third insulator provided on said surface of said semiconductor substrate,
said second insulator being provided also on said third insulator;
a first MOS element having said third insulator as a first gate insulating film and isolated from an adjacent first MOS element by said trench; and
a second MOS element having said second and third insulators as a second gate insulating film and isolated from an adjacent second MOS element by said trench.

3. The semiconductor device of claim 1, wherein said conductor is polycrystalline silicon and said first insulator is silicon oxide.

4. The semiconductor device of claim 2, wherein said conductor is polycrystalline silicon and said first insulator is silicon oxide.

* * * * *